(12) United States Patent
Figura et al.

(10) Patent No.: US 6,607,966 B2
(45) Date of Patent: Aug. 19, 2003

(54) SELECTIVE METHOD TO FORM ROUGHENED SILICON

(75) Inventors: Thomas A. Figura, Boise, ID (US); Zhiqiang Wu, Plano, TX (US); Li Li, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/039,022

(22) Filed: Jan. 2, 2002

(65) Prior Publication Data

US 2002/0058392 A1 May 16, 2002

Related U.S. Application Data (63) Continuation of application No. 09/093,217, filed on Jun. 8, 1998, now Pat. No. 6,355,536.

(51) Int. Cl.[7] .......................................... H01L 21/8242
(52) U.S. Cl. ...................... 438/398; 438/253; 438/254; 438/255; 438/396; 438/397; 438/563
(58) Field of Search ................. 438/253, 254, 438/255, 396, 397, 398, 563

(56) References Cited

U.S. PATENT DOCUMENTS

| | | |
|---|---|---|
| 4,099,196 A | 7/1978 | Simko |
| 5,017,505 A | 5/1991 | Fujii et al. |
| 5,037,773 A | 8/1991 | Lee et al. |
| 5,066,604 A | 11/1991 | Chung et al. |
| 5,202,278 A | 4/1993 | Mathews et al. |
| 5,223,081 A | 6/1993 | Doan |
| 5,354,705 A | 10/1994 | Mathews et al. |
| 5,366,917 A | 11/1994 | Watanabe et al. |
| 5,407,534 A | 4/1995 | Thakur |
| 5,604,157 A | 2/1997 | Dai et al. |
| 5,612,558 A | 3/1997 | Harshfield |
| 5,623,243 A | 4/1997 | Watanabe et al. |
| 5,639,689 A | 6/1997 | Woo |
| 5,688,550 A | 11/1997 | Weimer et al. |
| 5,691,249 A | 11/1997 | Watanabe et al. |
| 5,696,014 A | 12/1997 | Figura |
| 5,700,710 A | 12/1997 | Zenke |
| 5,739,564 A | 4/1998 | Kosa et al. |
| 6,083,849 A | 7/2000 | Ping et al. |
| 6,087,248 A | 7/2000 | Rodder |

FOREIGN PATENT DOCUMENTS

JP    403257864 B2    11/1991

OTHER PUBLICATIONS

T. Mine, et al., "Capacitance–Enhanced Stacked–Capacitor with Engraved Storage Electrode for Deep Submicron DRAMSs", 1989, pp. 137–140.

Primary Examiner—Amir Zarabian
Assistant Examiner—Toniae M Thomas
(74) Attorney, Agent, or Firm—Killworth, Gottman, Hagan & Schaeff, L.L.P.

(57) ABSTRACT

A method of forming silicon storage nodes on silicon substrates, wherein the silicon storage nodes have a roughened surface, which does not result in deposition of silicon atoms over the entire surface of the silicon substrate and which does not require the silicon storage nodes to be comprised of amorphous silicon prior to being subjected to the surface-roughening treatment.

14 Claims, 12 Drawing Sheets

SELECTIVE METHOD TO FORM ROUGHENED SILICON

CROSS REFERENCE TO RELATED APPLICATIONS

This application is a continuation of U.S. patent application Ser. No. 09/093,217, filed Jun. 8, 1998, now U.S. Pat. No. 6,355,536 B1.

FIELD OF THE INVENTION

The present invention relates to semiconductor fabrication and in particular, to a method of selectively forming silicon having a desired surface roughness.

BACKGROUND OF THE INVENTION

As DRAM's increase in memory cell density, there is a continuous challenge to maintain a sufficiently high storage capacitance despite decreasing cell area. It is important that storage node capacitor cell plates be large enough to retain an adequate charge or capacitance in spite of parasitic capacitances and noise which may be present during circuit operation. The principal way of retaining high cell capacitance with increasing cell density is through cell structure techniques. Such techniques include three dimensional cell capacitors, such as trenched or stacked capacitors.

One way of increasing capacitance is to roughen the interfacing surfaces of the capacitor, thereby maximizing the surface area for stored capacitance. According to one method, the surface of a polycrystalline silicon is coated with spin-on-glass (SOG) containing photoresist particles. With the photoresist particles acting as a micromask, etching provides a micro roughness on the surface of the polycrystalline silicon film, thereby increasing the effective surface area of the polycrystalline silicon film. See "Capacitance-Enhanced Stacked-Capacitor with Engraved Storage Electrode for Deep Submicron DRAMS," *Solid State Devices and Materials*, 1989, pp. 137–140. However, in addition to the overall complexity of this method, this method requires strict control of the size of the resist particles, and the resist particles must be distributed at a uniform density at the time of the coating. Another method, described in U.S. Pat. No. 5,691,249, is based on the grain growth of silicon to produce micro roughness on the surface of a polycrystalline silicon layer. This is accomplished by depositing silicon on a substrate in accordance with a low pressure chemical vapor deposition (LPCVD) method or the like, carrying out the deposition at the temperature (referred to as transition temperature) at which the crystal state of the deposited film makes the transition from an amorphous phase to a polycrystalline phase. Alternatively, surface roughness is increased by a so called "seed and anneal" method whereby an amorphous silicon film is formed on a substrate in a vacuum or in an inert gas such as nitrogen gas, then subjecting the sample to a heating (annealing) treatment at a temperature above the transition temperature of the silicon, again in a vacuum or in an inert gas such as nitrogen gas. However, techniques based on the grain growth of silicon to produce micro roughness on the surface of a polycrystalline silicon layer result in some deposition of silicon atoms over the entire surface of the silicon substrate surface. In certain instances, deposition of silicon atoms over the entire surface of the silicon substrate surface is undesirable, such as, for example, in the fabrication of capacitors, where silicon deposits between storage nodes may cause shorts or conductive paths from one storage node to the next. In addition, because these methodologies selectively create polycrystalline silicon structures, it is necessary that the silicon storage nodes be comprised of amorphous silicon prior to being subjected to these methodologies.

Therefore, the need remains for a method of forming silicon storage nodes on silicon substrates, wherein the silicon storage nodes have a roughened surface which does not result in deposition of silicon atoms over the entire surface of the silicon substrate. Further, there also remains a need for a method of forming silicon storage nodes on silicon substrates which does not require the silicon storage nodes to be comprised of amorphous silicon prior to being subjected to the surface-roughening treatment.

SUMMARY OF THE INVENTION

That need is met by the present invention by providing a method of forming silicon storage nodes on silicon substrates, wherein the silicon storage nodes have a roughened surface, which does not result in deposition of silicon atoms over the entire surface of the silicon substrate and which does not require the silicon storage nodes to be comprised of amorphous silicon prior to being subjected to surface-roughening treatment.

BRIEF DESCRIPTION OF THE DRAWINGS

FIG. 13 also depicts a cross-sectional view of the silicon structure of FIG. 12 which has been planarized, showing singulation of the two cells.

DETAILED DESCRIPTION OF THE PREFERRED EMBODIMENTS

The present invention provides generally for a method of forming silicon storage nodes on silicon substrates, wherein the silicon storage nodes have a roughened surface, which method does not result in deposition of silicon atoms over the entire surface of the silicon substrate and which does not require the silicon storage nodes to be comprised of amorphous silicon prior to being subjected to the surface-roughening treatment.

The term "silicon substrate" refers to silicon structures, including silicon wafers, silicon structures in the process of fabrication, including silicon substrates in the process of fabrication, any layer on a silicon substrate which is in the process of fabrication, a semiconductor layer, including a semiconductor layer in the process of fabrication, and the like.

The term "silicon wafer" means either the lowest layer of a semiconductor material in a wafer or a wafer having additional layers of structures thereon.

The term "fabrication" or "patterned" means the process of forming patterns on a silicon structure or semiconductor structure through photolithography.

Figure 1:
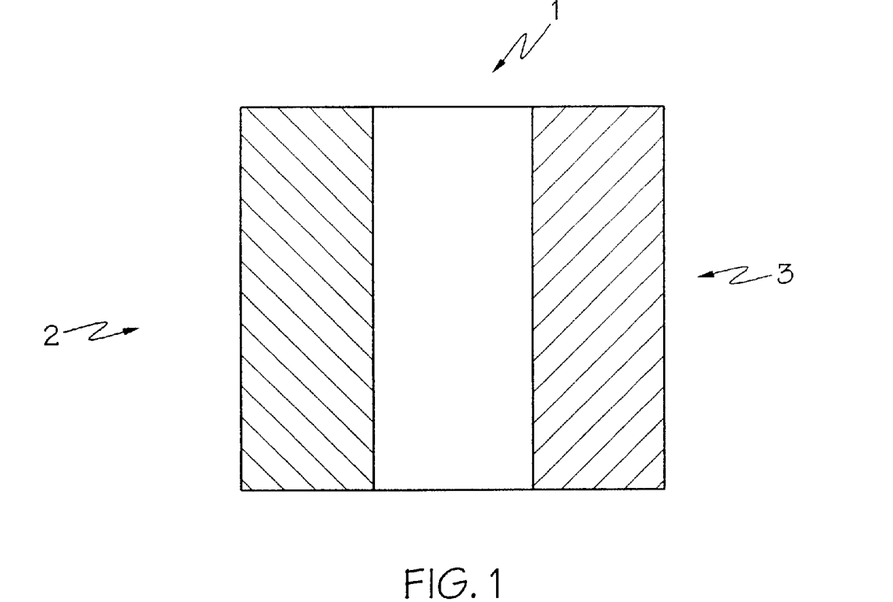
FIG. 1 depicts a cross-sectional view of a silicon substrate comprised of a silicon layer having a doped oxide on one side thereof and a material which is not a doped oxide on the other side thereof.

FIG. 1 depicts a cross-section of a silicon substrate comprised of a silicon layer 1 having a doped oxide 2 on one surface thereof and a material which is not a doped oxide 3 on the other surface thereof. Silicon layer 1 may be comprised of material selected from the group consisting of polycrystalline silicon and amorphous silicon. Typically, the silicon layer 1 will have a thickness of from about 250 Å to about 2 μm. The polycrystalline silicon and amorphous silicon may be either doped or undoped. When doped, the polycrystalline silicon and amorphous silicon will typically be doped with dopants generally known to one of ordinary skill in the art to increase conductivity of the silicon, such as phosphorus and arsenic. Doped oxide 2 may be selected from the group consisting of borophosphorus silicate glass, phosphorus doped silicon dioxide, and boron doped silicon dioxide. The dopants in doped oxide 2 will typically constitute from about 1% to about 10% by weight of the oxide. Material which is not doped oxide 3 may be any material which is not a doped oxide, and includes, but is not limited to, undoped silicon oxide, silicon, and a metalization layer.

Figure 2:
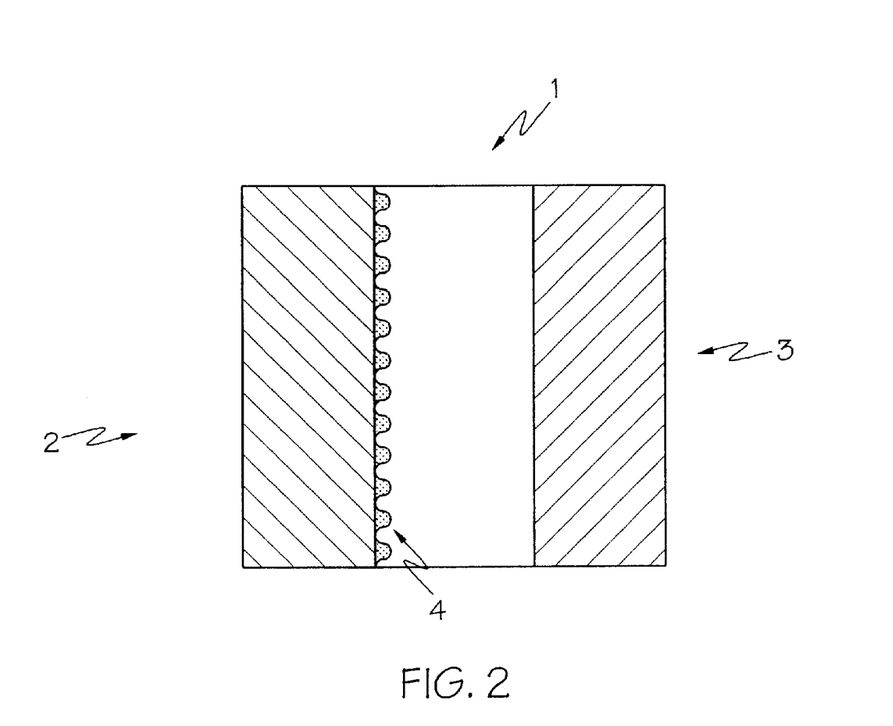
FIG. 2 depicts a cross-sectional view of the silicon substrate of FIG. 1 wherein dopants from the doped oxide have been driven into the silicon layer thereby forming regions of doped silicon within the silicon layer at the interface of the silicon layer and the doped oxide.

FIG. 2 depicts a cross-section of a silicon substrate of FIG. 1 wherein dopants from the doped oxide 2 have been driven into the silicon layer 1 thereby forming regions of doped silicon 4 within the silicon layer 1 at the interface of the silicon layer 1 and the doped oxide 2. The regions are not drawn to scale, but rather are exaggerated for purposes of illustration. The dopants from the doped oxide 2 are driven into the silicon layer 1, for example, by heating the silicon substrate of FIG. 1 at a temperature in the range of from about 700° C. to about 1150° C., with about 1000° C. being preferred for a period of time ranging from about 10 seconds to about 2 hours, with about 20 seconds at about 1000° C. being preferred. The dopants from doped oxide 2 which are driven into silicon layer 1 are selected from the group consisting of phosphorus, boron, and mixtures thereof.

Figure 3:
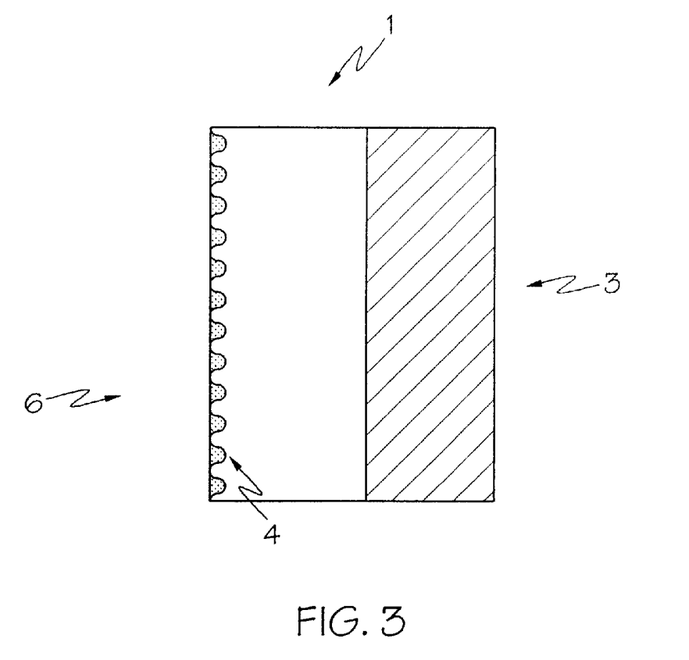
FIG. 3 depicts a cross-sectional view of the silicon substrate of FIG. 2 wherein the doped oxide has been removed, thereby exposing a first surface of the silicon layer, and showing regions of doped silicon at the exposed first surface of the silicon layer.

FIG. 3 depicts a cross-section of the silicon substrate of FIG. 2 wherein the doped oxide 2 has been removed, thereby exposing a first surface 6 of the silicon layer 1, and showing regions of doped silicon 4 at the exposed first surface 6 of the silicon layer 1. Removal of the doped oxide 2 is accomplished by techniques well known to one of ordinary skill in the art and include, for example, treatment with a wet etchant such as hydrofluoric acid (HF). Alternatively, removal of the doped oxide 2 may be accomplished by means of dry etchants. Suitable dry etchants include fluorine based gases such as $CH_2F_2$ and $C_4F_8$.

Figure 4:
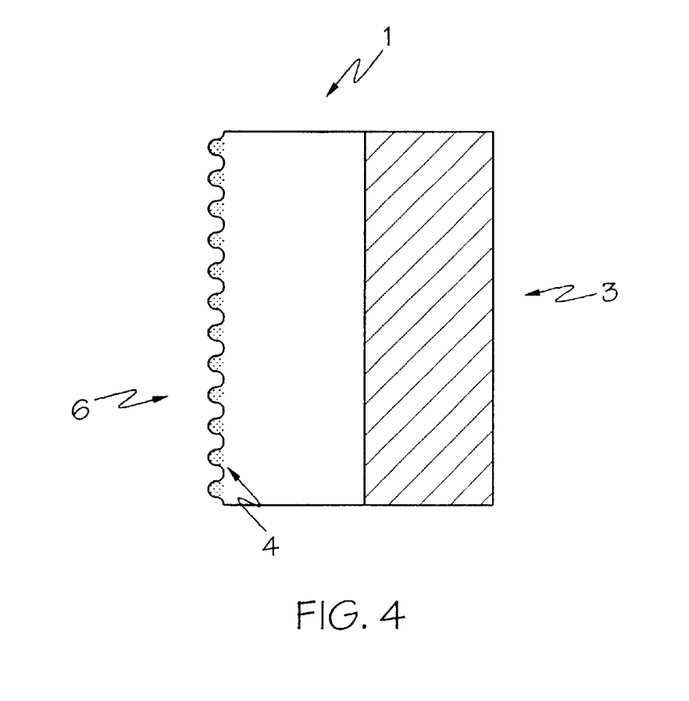
FIG. 4 depicts a cross-sectional view of the silicon substrate of FIG. 3, wherein the exposed first surface of the silicon layer has been roughened by selective etching, showing protrusions comprised of doped silicon at the exposed first surface of the silicon layer.

FIG. 4 depicts a cross-section of the silicon substrate of FIG. 3, wherein the exposed first surface 6 of the silicon layer 1 has been roughened by selective etching, showing protrusions comprised of regions of doped silicon 4 at the exposed first surface 6 of the silicon layer 1. Selective etching is accomplished by treating the silicon substrate of FIG. 3 with a suitable basic reagent for a period of time ranging from about 10 seconds to about 1 hour, with about 3 minutes being preferred. Suitable basic regents are tetramethylammonium hydroxide, ammonium hydroxide, potassium hydroxide, and sodium hydroxide, with tetramethylammonium hydroxide being preferred. Such basic reagents do not etch the regions of doped silicon 4 as quickly as they etch the undoped regions of silicon and therefore such treatment results in protrusions comprised of regions of doped silicon 4 at the exposed first surface 6 of the silicon layer 1.

Figure 5:
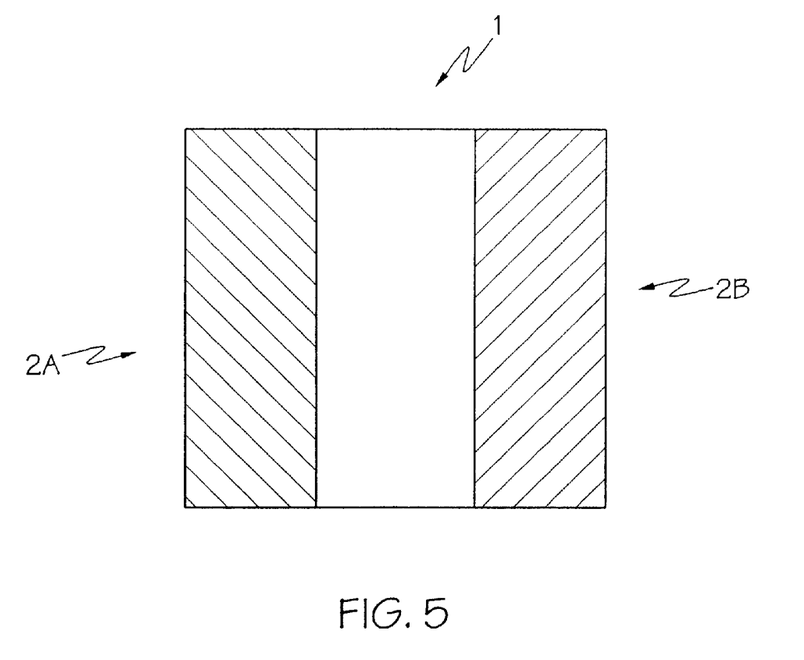
FIG. 5 depicts a cross-sectional view of a silicon substrate comprised of a silicon layer having a first doped oxide on one side thereof and a second doped oxide on the other side thereof.

FIG. 5 depicts a cross-section of a silicon substrate comprised of a silicon layer 1 having a first doped oxide 2a on one surface thereof and a second doped oxide 2b on the other surface thereof. Doped oxides 2a and 2b may be the same or different and are as described previously with reference to the embodiments in FIGS. 1–4. Silicon layer 1 is as described previously in FIG. 1.

Figure 6:
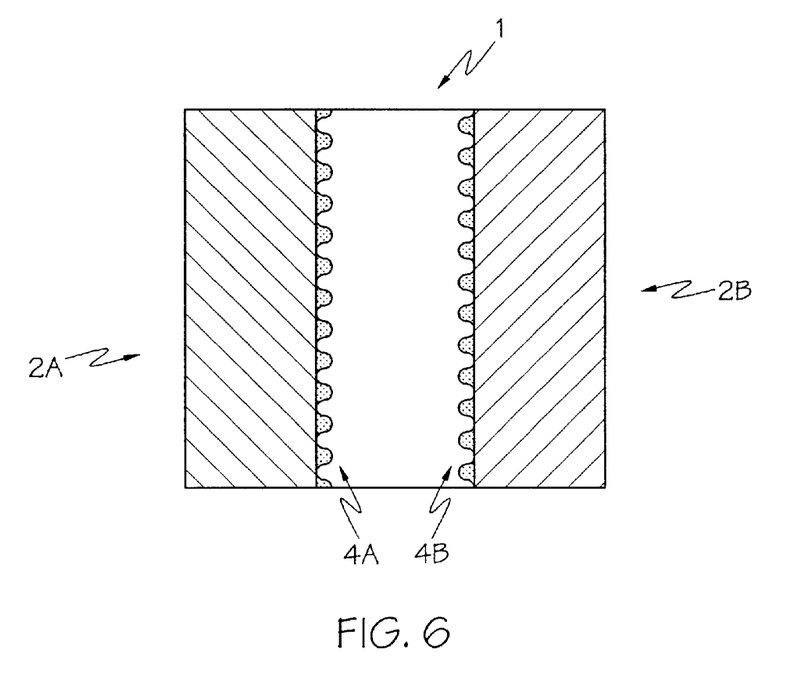
FIG. 6 depicts a cross-sectional view of the silicon substrate of FIG. 5 wherein dopants from the first and second doped oxides have been driven into the silicon layer thereby forming regions of doped silicon within the silicon layer at the interface of the silicon layer and the first doped oxide and at the interface of the silicon layer and the second doped oxide.

FIG. 6 depicts a cross-section of the silicon substrate of FIG. 5 wherein dopants from the first doped oxide 2a and second doped oxide 2b have been driven into the silicon layer 1 thereby forming regions of doped silicon 4a within the silicon layer 1 at the interface of the silicon layer 1 and the first doped oxide 2a and regions of doped silicon 4b within the silicon layer 1 at the interface of the silicon layer 1 and the second doped oxide 2b. The dopants from the doped oxide 2 are driven into the silicon layer 1 essentially as described previously with respect to the embodiment shown in FIG. 2.

Figure 7:
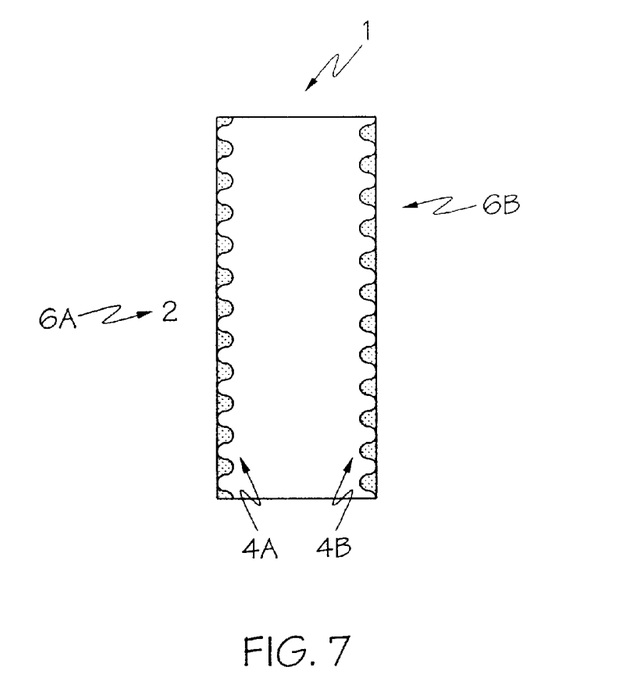
FIG. 7 depicts a cross-sectional view of the silicon substrate of FIG. 6 wherein the first doped oxide and second doped oxide have been removed, thereby exposing first and second surfaces of the silicon layer, and showing regions of doped silicon at the exposed first surface and exposed second surface of the silicon layer.

FIG. 7 depicts a cross-section of the silicon substrate of FIG. 6 wherein the first doped oxide 2a and second doped oxide 2b have been removed, thereby exposing a first surface of the silicon layer 6a and a second surface of the silicon layer 6b, and showing regions of doped silicon at the exposed first surface and exposed second surface of the silicon layer. Doped oxides 2a and 2b are removed essentially as described previously with respect to the embodiment shown in FIG. 3.

Figure 8:
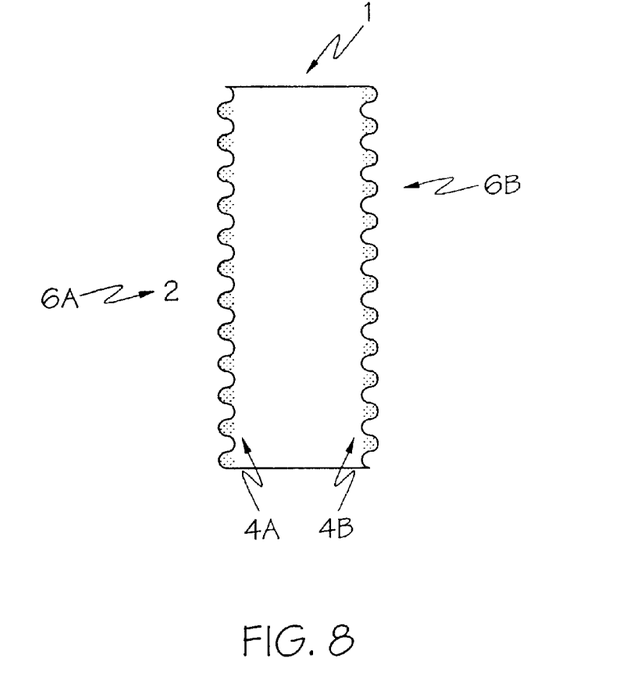
FIG. 8 depicts a cross-sectional view of the silicon substrate of FIG. 7, wherein the exposed first surface and exposed second surface of the silicon layer have been roughened by selective etching, showing protrusions comprised of doped silicon at the first exposed surface and second exposed surface of the silicon layer.

FIG. 8 depicts a cross-section of the silicon substrate of FIG. 7, wherein the exposed first surface 6a and exposed second surface 6b of the silicon layer 1 have been roughened by selective etching, showing protrusions comprised of regions of doped silicon 4a at the first exposed surface 6a and protrusions comprised of regions of doped silicon 4b at the second exposed surface 6b of the silicon layer 1. Selective etching is accomplished essentially as described previously with respect to the embodiment shown in FIG. 4.

Figure 9:
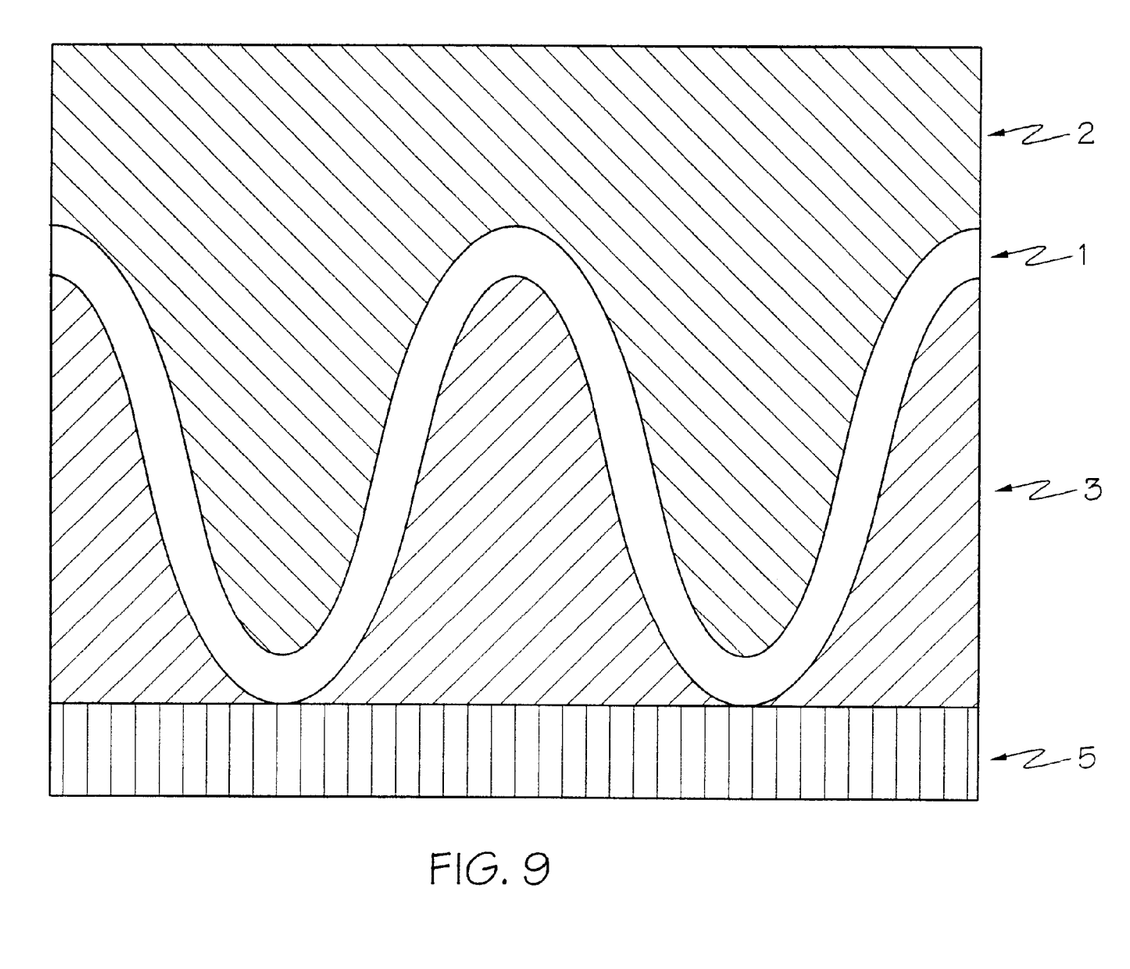
FIG. 9 depicts a cross-sectional view of a silicon structure comprised of a silicon substrate overlaid with a layer of a material which is not a doped oxide and patterned, then overlaid with a conformal silicon layer, then overlaid with a doped oxide. The silicon structure of FIG. 9 depicts a two-cell capacitor array in the process of fabrication prior to singulation of the cells.

FIG. 9 depicts a cross-section of a silicon structure comprised of a silicon substrate 5 overlaid with a layer of a material which is not a doped oxide 3 and patterned, then overlaid with a conformal silicon layer 1, then overlaid with a doped oxide 2. The silicon structure of FIG. 9 is a two-cell capacitor array in the process of fabrication prior to singulation of the cells. Doped oxide 2, material which is not a doped oxide 3, and silicon layer 1 are as described previously with respect to the embodiment shown in FIG. 1.

Figure 10:
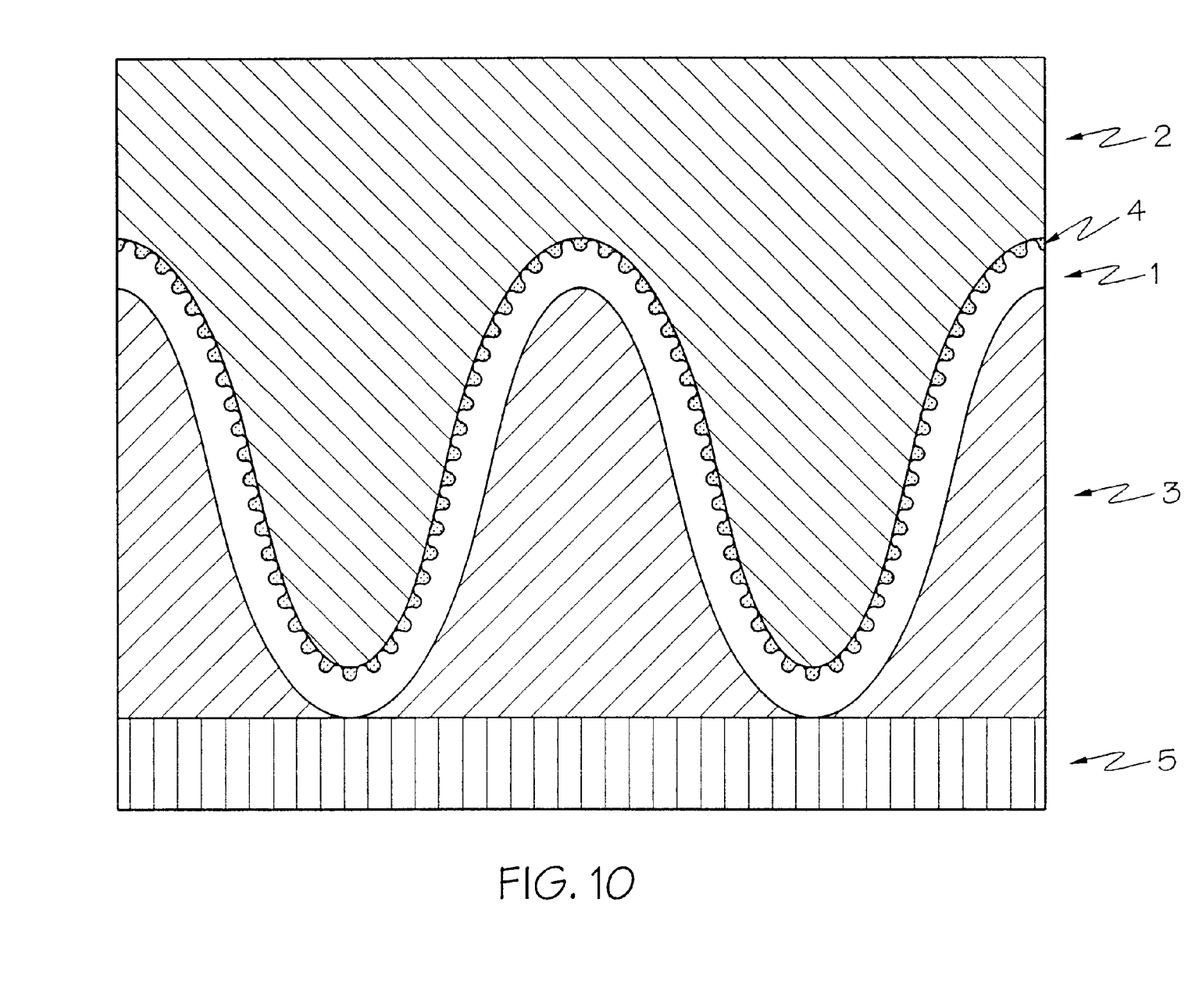
FIG. 10 depicts a cross-sectional view of the silicon structure of FIG. 9 wherein dopants from the doped oxide have been driven into the silicon layer thereby forming regions of doped silicon within the silicon layer at the interface of the silicon layer and the doped oxide.

FIG. 10 depicts a cross-section of the silicon structure of FIG. 9 wherein dopants from the doped oxide 2 have been driven into the silicon layer 1 thereby forming regions of doped silicon 4 within the silicon layer 1 at the interface of the silicon layer 1 and the doped oxide 2. The dopants from the doped oxide 2 are driven into the silicon layer 1 essentially as described previously with respect to the embodiment shown in FIG. 2.

Figure 11:
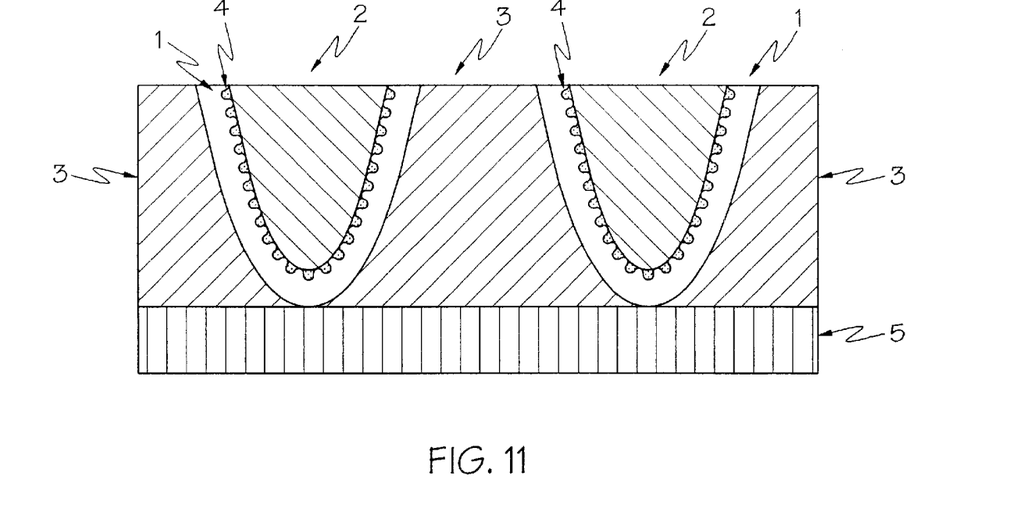
FIG. 11 depicts a cross-sectional view of the silicon structure of FIG. 10 which has been planarized, showing singulation of the two cells.

After the dopants from the doped oxide 2 have been driven into the silicon layer 1 as described with respect to the embodiment described in FIG. 10, the silicon structure may be planarized, resulting in singulation of the two cells, followed by removal of the doped oxide 2 to expose the inside surface 7 of the silicon layer 1 of each cell. This process is depicted by FIGS. 11 and 13 as described in more detail below. Alternatively, the doped oxide 2 may removed from the silicon structure of FIG. 10, thereby exposing the inside surface 7 of the silicon layer 1 of each cell prior to singulation, followed by planarization to singulate the cells. This process is depicted by FIGS. 12 and 13 as described in more detail below.

FIG. 11 depicts a cross-section of the silicon structure of FIG. 10 which has been planarized, showing singulation of the two cells. Planarization of the silicon structure of FIG. 10 is accomplished by procedures and techniques well known to one of ordinary skill in the art and include mechanical planarization, chemical planarization, and chemical mechanical polishing, with chemical mechanical polishing (CMP) techniques being preferred.

Figure 12:
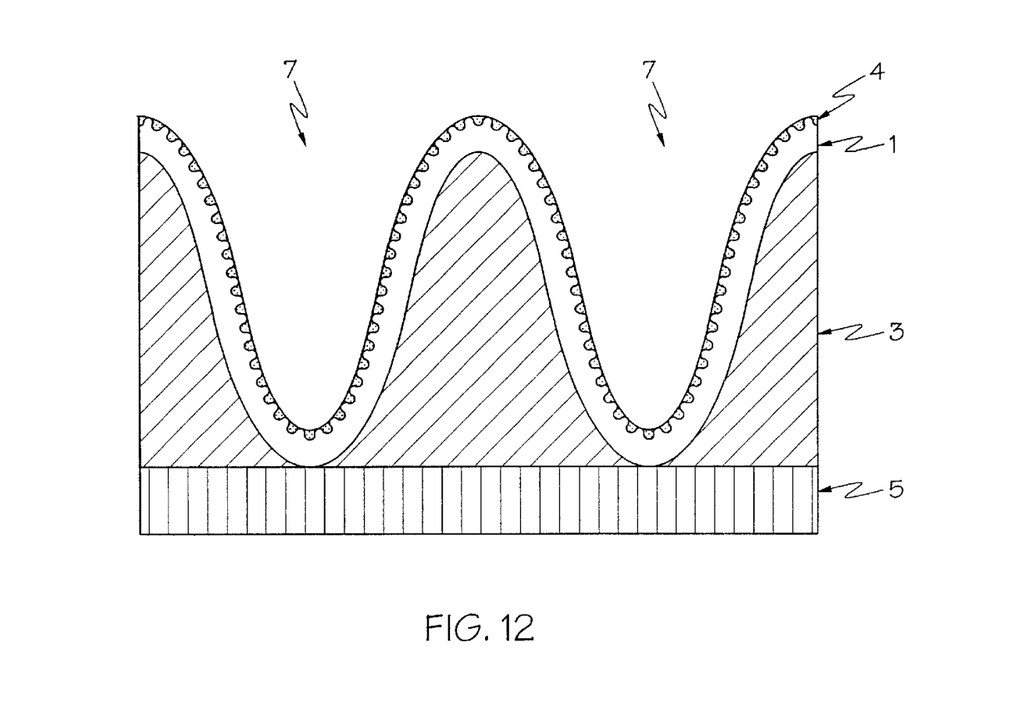
FIG. 12 depicts a cross-sectional view of the silicon structure of FIG. 10 wherein the doped oxide has been removed, thereby exposing the inside surfaces of the silicon layers of each cell prior to singulation, and showing regions of doped silicon at the exposed inside surfaces of the silicon layers of each cell prior to singulation.
Figure 13:
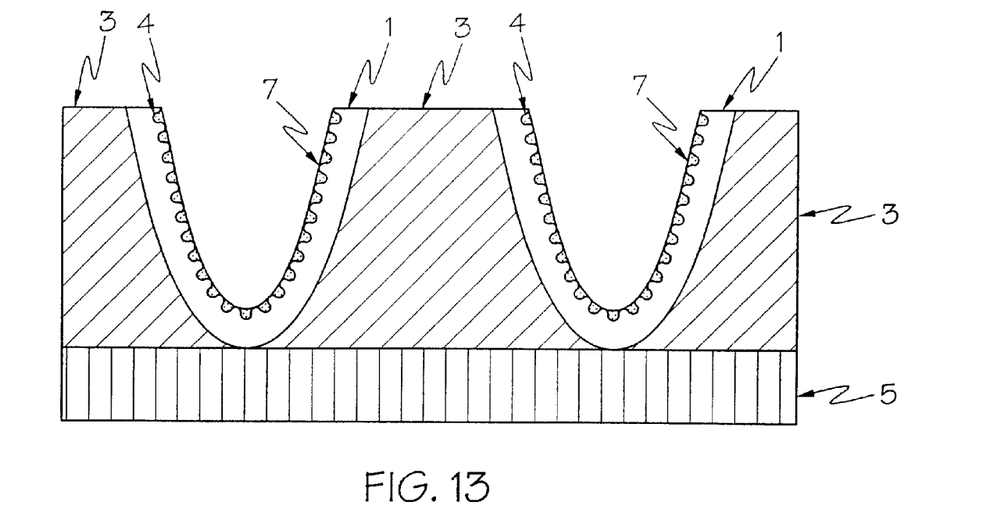
FIG. 13 depicts a cross-sectional view of the silicon structure of FIG. 11 wherein the doped oxide has been removed, thereby exposing the inside surfaces of the silicon layers of each cell, and showing regions of doped silicon at the exposed inside surfaces of the silicon layers of each cell.

FIG. 12 depicts a cross-section of the silicon structure of FIG. 10 wherein the doped oxide 2 has been removed, thereby exposing the inside surface 7 of the silicon layer 1 prior to the singulation of the two cells and showing regions of doped silicon 4 at the exposed inside surface 7 of the silicon layer 1 of each cell prior to singulation. Doped oxides 2 is removed essentially as described previously with respect to the embodiment shown in FIG. 3.

FIG. 13 depicts a cross-section of the silicon structure of FIG. 11 wherein the doped oxide 2 has been removed, thereby exposing the inside surface 7 of the silicon layer 1 of each cell, and showing regions of doped silicon 4 at the exposed inside surface 7 of the silicon layer 1 of each cell. Doped oxides 2 is removed essentially as described previously with respect to the embodiment shown in FIG. 3. FIG. 13 also depicts a cross-section of the silicon structure of FIG. 12 which has been planarized, showing singulation of the two cells. Planarization of the silicon structure of FIG. 12 may be accomplished essentially as described previously with respect to the embodiment shown in FIG. 11.

Figure 14:
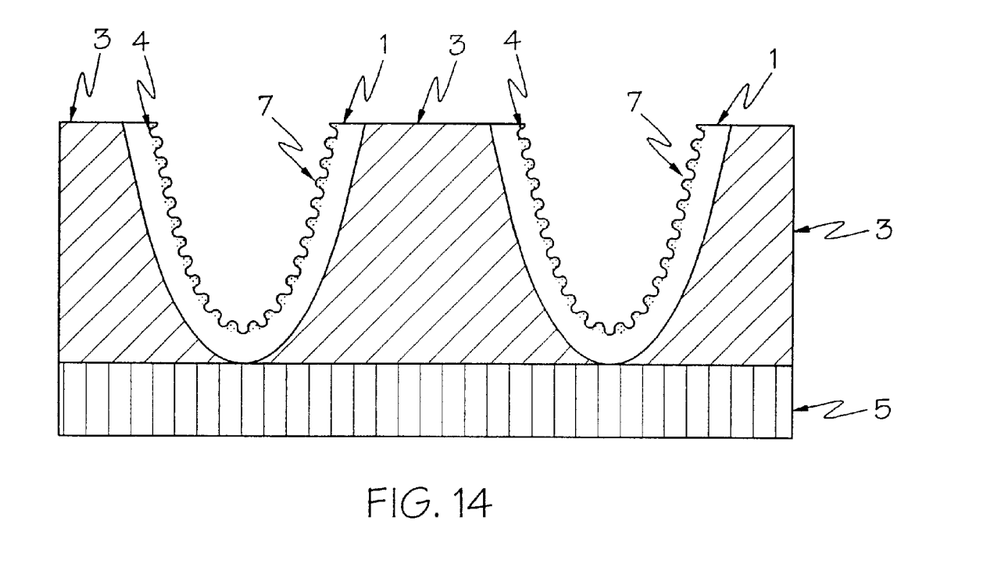
FIG. 14 depicts a cross-sectional view of the silicon structure of FIG. 13, wherein the exposed inside surfaces of the silicon layers of each cell have been roughened by selective etching, showing protrusions comprised of doped silicon at the exposed inside surfaces of the silicon layers of each cell.

FIG. 14 depicts a cross-section of the silicon structure of FIG. 13, wherein the exposed inside surface 7 of the silicon layer 1 of each cell have been roughened by selective etching, showing protrusions comprised of regions doped silicon 4 at the exposed inside surface 7 of the silicon layer 1 of each cell. Selective etching is essentially as described previously with respect to the embodiment shown in FIG. 4.

Figure 15:
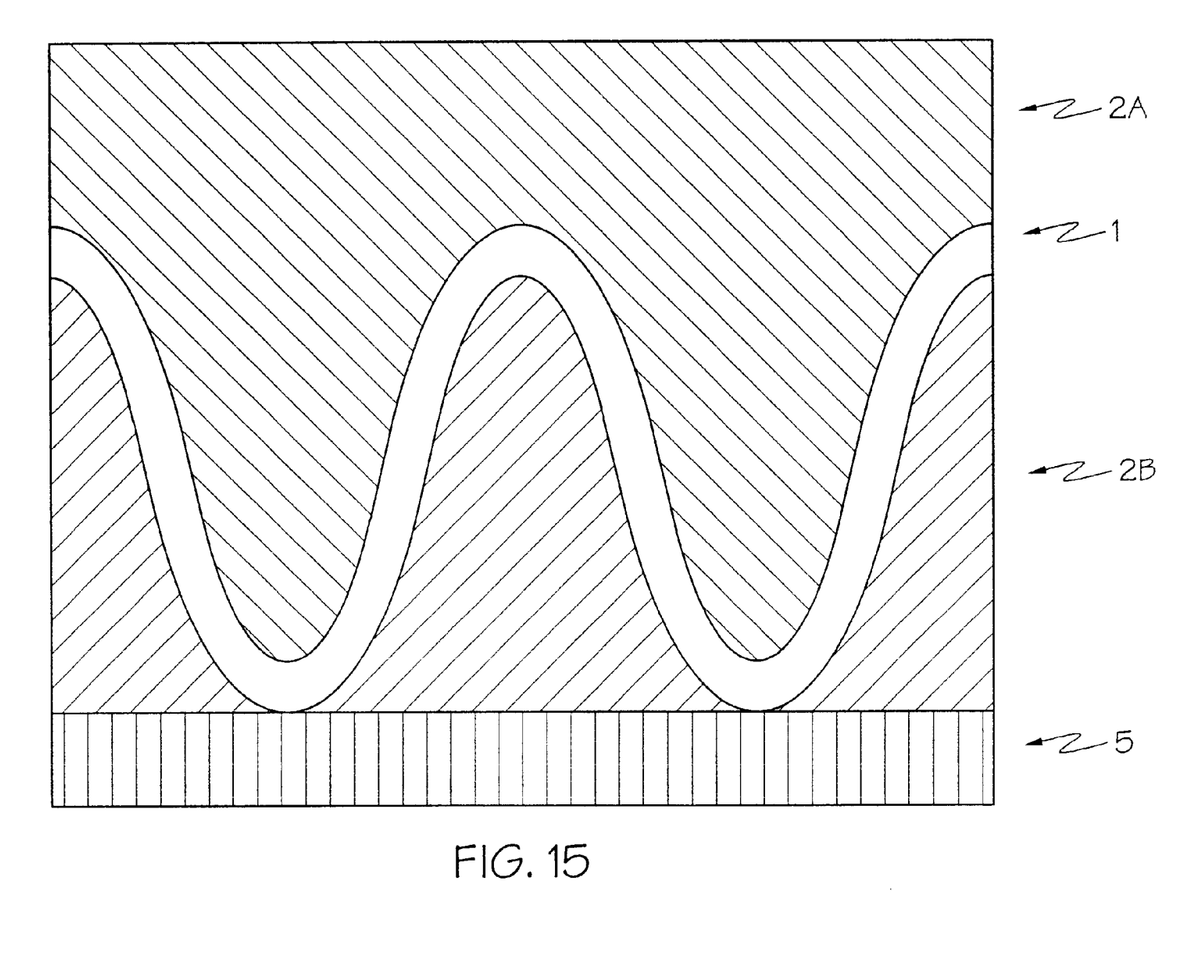
FIG. 15 depicts a cross-sectional view of a silicon structure, wherein a silicon substrate has been overlaid with a first doped oxide and patterned, then overlaid with a conformal silicon layer, then overlaid with a second doped oxide. The silicon structure of FIG. 15 depicts a two-cell capacitor array in the process of fabrication prior to singulation of the cells.

FIG. 15 depicts a cross-section of a silicon structure, wherein a silicon substrate 5 has been overlaid with a first doped oxide 2b and patterned, then overlaid with a conformal silicon layer 1, then overlaid with a second doped oxide 2b. The silicon structure of FIG. 15 is a two-cell capacitor array in the process of fabrication prior to singulation of the cells. Doped oxides 2a and 2b, and silicon layer 1 are as described previously with respect to the embodiment shown in FIG. 1.

Figure 16:
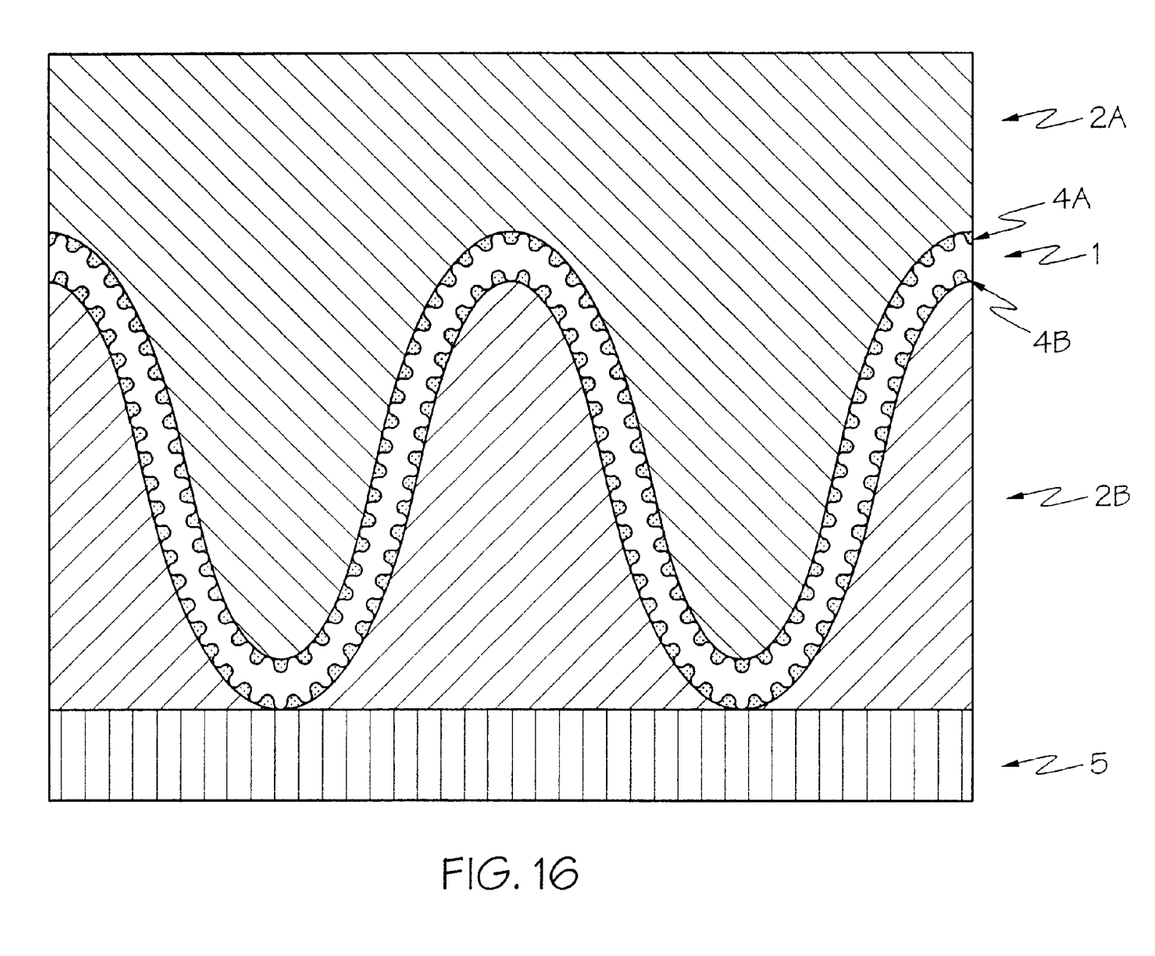
FIG. 16 depicts a cross-sectional view of the silicon structure of FIG. 15 wherein dopants from the first and second doped oxides have been driven into the silicon layer thereby forming regions of doped silicon within the silicon layer at the interface of the silicon layer and the first doped oxide and at the interface of the silicon layer and the second doped oxide.

FIG. 16 depicts a cross-section of the silicon structure of FIG. 15 wherein dopants from the first doped oxide 2a and second doped oxide 2b have been driven into the silicon layer 1 thereby forming regions of doped silicon 4a within the silicon layer 1 at the interface of the silicon layer 1 and the first doped oxide 2a and regions of doped silicon 4b within the silicon layer 1 at the interface of the silicon layer 1 and the second doped oxide 2b. The dopants from doped oxide 2a and 2b are driven into the silicon layer 1 essentially as described previously with respect to the embodiment shown in FIG. 2.

Figure 17:
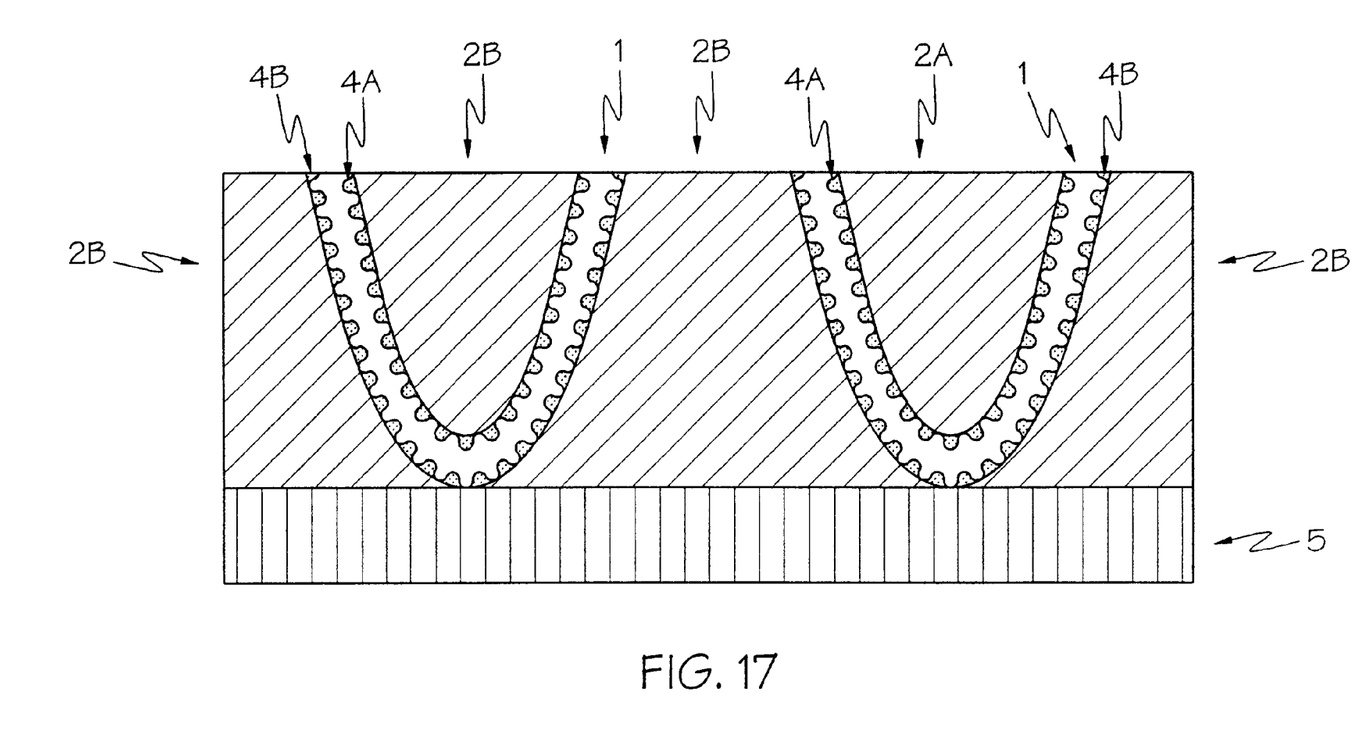
FIG. 17 depicts a cross-sectional view of the silicon structure of FIG. 16 which has been planarized, thereby resulting in singulation of the two cells.

FIG. 17 depicts a cross-section of the silicon structure of FIG. 16 which has been planarized, thereby resulting in singulation of the two cell as described previously with respect to the embodiments shown in FIGS. 11 and 13.

Figure 18:
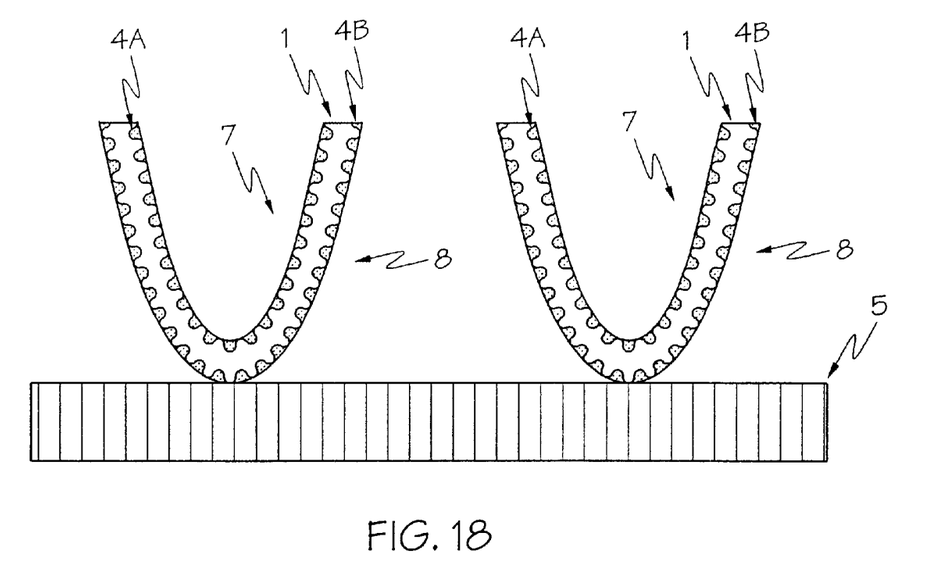
FIG. 18 depicts a cross-sectional view of the silicon structure of FIG. 17 wherein the first and second doped oxides have been removed, thereby exposing the inside surfaces and outside surfaces of the silicon layers of each cell, and showing regions of doped silicon at the exposed inside surfaces and exposed outside surfaces of the silicon layers of each cell.

FIG. 18 depicts a cross-section of the silicon structure of FIG. 17 wherein the first doped oxide 2a and second doped oxide 2b have been removed, thereby exposing the inside surface 7 and outside surface 8 of the silicon layer 1 of each cell, and showing regions of doped silicon 4a at the exposed inside surface 7 and regions of doped silicon 4b at the exposed outside surface 8 of the silicon layer 1 of each cell. Doped oxides 2a and 2b are removed essentially as described previously with respect to the embodiment shown in FIG. 3.

Figure 19:
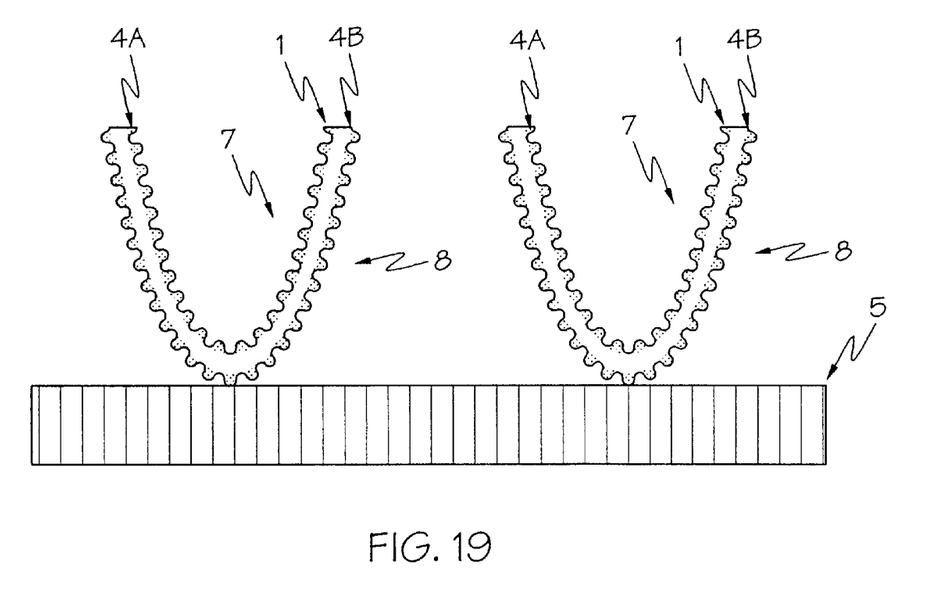
FIG. 19 depicts a cross-sectional view of the silicon structure of FIG. 18, wherein the exposed inside surfaces and outside surfaces of the silicon layers of each cell have been roughened by selective etching, showing protrusions comprised of doped silicon at the exposed inside and at the exposed outside surfaces of the silicon layers of each cell.

FIG. 19 depicts a cross-section of the silicon structure of FIG. 18, wherein the exposed inside surface 7 and exposed outside surface 8 of the silicon layer 1 of each cell have been roughened by selective etching, showing protrusions comprised of regions of doped silicon 4a at the exposed inside surface 7 and protrusions comprised of regions of doped silicon 4b at the exposed outside surface 8 of the silicon layer 1 of each cell. Selective etching is essentially as described previously with respect to the embodiment shown in FIG. 4.

What is claimed is:

1. A method of forming at least one roughened surface on a silicon layer comprising:
    a) providing a substrate including a silicon layer having at least one interface with a layer of doped oxide;
    b) driving the dopants from the doped oxide into the silicon layer forming regions of doped silicon;
    c) removing the doped oxide to form at least one exposed surface of the silicon layer containing doped regions; and
    d) treating the substrate to form a roughened surface on at least one exposed surface of the silicon layer containing doped regions.

2. A method according to claim 1 wherein the doped oxide is borophosphorus silicate glass.

3. A method according to claim 1 wherein the dopants which are driven into the silicon layer are selected from phosphorus, boron, or mixtures thereof.

4. A method according to claim 1 wherein the roughened surface is formed by treating said silicon substrate with a basic reagent selected from tetramethylammonium hydroxide, ammonium hydroxide, potassium hydroxide, or sodium hydroxide.

5. A method according to claim 1 wherein the silicon layer is comprised of material selected from polycrystalline silicon or amorphous silicon.

6. A method according to claim 5 wherein the silicon layer is comprised of polycrystalline silicon.

7. A method according to claim 6 wherein the polycrystalline silicon is undoped polycrystalline silicon.

8. A method according to claim 6 wherein the polycrystalline silicon is doped polycrystalline silicon.

9. A method according to claim 8 wherein the doped polycrystalline silicon is selected from phosphorus doped polycrystalline silicon or arsenic doped polycrystalline silicon.

10. A method according to claim 5 wherein the silicon layer is comprised of amorphous silicon.

11. A method according to claim 10 wherein the amorphous silicon is undoped amorphous silicon.

12. A method according to claim 10 wherein the amorphous silicon is doped amorphous silicon.

13. A method according to claim 12 wherein the doped amorphous silicon is selected from phosphorus doped amorphous silicon or arsenic doped amorphous silicon.

14. A silicon layer having at least one roughened surface thereon, wherein the roughened surface is comprised of protruding regions of silicon which contain dopants from a doped oxide, said silicon layer being prepared by the process comprising the steps of:
    a) providing a silicon substrate comprised of a silicon layer having at least one interface with a layer of doped oxide;
    b) driving dopants from the doped oxide into the silicon layer forming regions of doped silicon;
    c) removing the doped oxide to form at least one exposed surface of the silicon layer containing doped regions; and
    d) treating the silicon substrate to form a roughened surface on at least one exposed surface of the silicon layer containing doped regions, thereby forming a silicon layer having at least one roughened surface thereon, wherein the roughened surface is comprised of protruding regions of silicon which contain dopants from the doped oxide.

* * * * *